US011756492B2

(12) United States Patent
Li et al.

(10) Patent No.: US 11,756,492 B2
(45) Date of Patent: Sep. 12, 2023

(54) DISPLAY PANEL, SHIFT REGISTER CIRCUIT AND DRIVING METHOD THEREOF

(71) Applicants: Wuhan Tianma Micro-Electronics Co., Ltd., Wuhan (CN); Wuhan Tianma Microelectronics Co., Ltd. Shanghai Branch, Shanghai (CN); Tianma Micro-Electronics Co., Ltd., Shenzhen (CN)

(72) Inventors: Yue Li, Shanghai (CN); Dong Qian, Shanghai (CN); Gang Liu, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 17/339,240

(22) Filed: Jun. 4, 2021

(65) Prior Publication Data
US 2021/0343255 A1  Nov. 4, 2021

Related U.S. Application Data

(63) Continuation of application No. 15/594,765, filed on May 15, 2017, now abandoned.

(30) Foreign Application Priority Data

Nov. 18, 2016  (CN) .......................... 201611018079.6

(51) Int. Cl.
*G11C 19/00* (2006.01)
*G09G 3/34* (2006.01)
(Continued)

(52) U.S. Cl.
CPC ............. *G09G 3/3426* (2013.01); *G09G 3/20* (2013.01); *G09G 3/34* (2013.01); *G09G 3/3677* (2013.01);
(Continued)

(58) Field of Classification Search
CPC .................. G09G 3/3426; G09G 3/34; G09G 2310/0286; G11C 19/184; G11C 19/28; G11C 19/287
See application file for complete search history.

(56) References Cited

U.S. PATENT DOCUMENTS 5,694,061 A * 12/1997 Morosawa ........... G09G 3/3648
326/119
2008/0219401 A1* 9/2008 Tobita .................... G11C 19/28
377/79
(Continued)

FOREIGN PATENT DOCUMENTS

CN           105405381 A      3/2016

*Primary Examiner* — Tuan T Lam
(74) *Attorney, Agent, or Firm* — Anova Law Group, PLLC

(57) ABSTRACT

A display panel, a stage circuit, and a driving method of the stage circuit are provided. The stage circuit includes cascaded shift register circuits. Each cascaded shift register circuit includes: a first control module, a second control module, and an output module. The first control module receives an input signal and a charging signal, and generates a voltage signal at a second node in response to a first clock signal and a voltage signal at a first node. With an exception of a first stage cascaded shift register circuit, a first transistor of a current stage cascaded shift register circuit has a first end connected to a signal output terminal of a previous stage
(Continued)

cascaded shift register circuit, a second end connected to the second node, and a control end connected to the first node.

16 Claims, 9 Drawing Sheets

(51) Int. Cl.
    *G11C 19/28*         (2006.01)
    *G11C 19/18*         (2006.01)
    *G09G 3/20*          (2006.01)
    *G09G 3/36*          (2006.01)
(52) U.S. Cl.
    CPC ............ *G11C 19/184* (2013.01); *G11C 19/28* (2013.01); *G11C 19/287* (2013.01); *G09G 2310/0286* (2013.01)

(56) References Cited

U.S. PATENT DOCUMENTS

2014/0375616 A1* 12/2014 Kim .................... G09G 3/3266
                                                   345/211
2016/0335962 A1   11/2016 Xiao \* cited by examiner

DISPLAY PANEL, SHIFT REGISTER CIRCUIT AND DRIVING METHOD THEREOF

CROSS-REFERENCES TO RELATED APPLICATIONS

This application is a continuation of U.S. patent application Ser. No. 15/594,765, filed on May 15, 2017, which claims priority of Chinese Patent Application No. 201611018079.6, filed on Nov. 18, 2016, the entire contents of which are hereby incorporated by reference.

BACKGROUND

Shift register circuits may be configured to form a gate electrode driving circuit. The gate electrode driving circuit may include N cascaded shift register circuits. In particular, an input signal of a $(m+1)^{th}$ shift register circuit is an output signal of an $m^{th}$ shift register circuit, where m<N.

FIG. 1A illustrates an existing circuit diagram of a shift register circuit. FIG. 1B illustrates a control timing sequence diagram of a shift register circuit in FIG. 1A. Referring to FIG. 1A and FIG. 1B, at a t1 moment, a clock signal CK and an input signal IN have low voltage levels. The low voltage level signals are written into nodes N1 and N2, respectively, and a high voltage level is outputted. At a t2 moment, the input signal IN changes to a high voltage level. The high voltage level signal is written into the node N2, and the node N1 maintains a low voltage level.

Further, when a falling edge of a second clock signal CKB arrives, a low voltage level is outputted, and the voltage level at the node N1 is further lowered because of the coupling effect of a capacitor C2, thus ensuring a complete output of the low voltage level. At a t3 moment, the first clock signal CK once again changes to a low voltage level. The low voltage level is written into the node N2, and a high voltage is written into the node N1. Such a voltage relationship may be maintained to ensure the output of a high voltage level. In such a circuit, the first clock signal CK and the second clock signal CKB are inversely related.

In the circuit illustrated in FIG. 1A, the nodes N1 and N2 have no continuous voltage supply to maintain a stable voltage level. After the moment t3 ends, the circuit is often expected to constantly output a high voltage signal. However, a parasitic capacitance (also known as stray capacitance) exists between the gate electrode (the node N1) and the drain electrode (terminal CKB) of the transistor M4, and the signal CKB coupled to the drain electrode of the transistor M4 is a square-wave signal that varies abruptly and frequently. The frequent variation of the signal CKB renders a corresponding change in the voltage level at the node N1. Accordingly, the transistor M4 may be turned on by mistake when the signal CKB is at a low voltage level, thereby causing the output signal to be unstable.

The disclosed display panel, shift register circuit and driving method thereof are directed to solving at least partial problems set forth above and other problems. It should be noted that, the information disclosed in the aforementioned background section is only used to enhance understanding of the background of the present disclosure, and may thus include existing information readily known to those ordinarily skilled in the art.

BRIEF SUMMARY OF THE DISCLOSURE

One aspect of the present disclosure provides a shift register circuit. The shift register circuit comprises a first transistor, a second transistor, a third transistor, a fourth transistor, a fifth transistor, a sixth transistor, a seventh transistor, a first capacitor, and a second capacitor. The first transistor is configured to be turned on in response to a voltage signal at a first node, such that an input signal is provided to a second node. The second transistor is configured to be turned on in response to a first clock signal, such that the input signal is provided to the first node. The third transistor is configured to be turned on in response to the first clock signal, such that a charging signal is provided to a second node. The fourth transistor is configured to be turned on in response to a voltage signal at the second node, such that a first voltage signal is provided to a third node. The fifth transistor is configured to be turned on in response to a second clock signal, such that a voltage signal at the third node is provided to the first node. The sixth transistor is configured to be turned on in response to the voltage signal at the second node, such that the first voltage signal is provided to a signal output terminal. The seventh transistor is configured to be turned on in response to a voltage signal at a fourth node, such that the second clock signal is provided to the signal output terminal, where the voltage at the fourth node is positively correlated to the voltage at the first node. The first capacitor is electrically connected between the fourth node and the signal output terminal, and the second capacitor is electrically connected between the second node and the first voltage signal.

Another aspect of the present disclosure provides a driving method of a shift register circuit. The shift register circuit comprises a first transistor configured to be turned on in response to a voltage signal at a first node to provide an input signal to a second node, a second transistor configured to be turned on in response to a first clock signal to provide the input signal to the first node, a third transistor configured to be turned on in response to the first clock signal to provide a charging signal to a second node, a fourth transistor configured to be turned on in response to a voltage signal at the second node to provide a first voltage signal to a third node, a fifth transistor configured to be turned on in response to a second clock signal to provide a voltage signal at the third node to the first node, a sixth transistor configured to be turned on in response to the voltage signal at the second node to provide the first voltage signal to a signal output terminal, a seventh transistor configured to be turned on in response to a voltage signal at a fourth node to provide the second clock signal to the signal output terminal, a first capacitor electrically connected between the fourth node and the signal output terminal, and a second capacitor electrically connected between the second node and the first voltage signal, and a voltage at the fourth node is positively correlated to a voltage at the first node. The driving method comprises in a first stage, controlling, by the first clock signal, the input signal and the first voltage signal, the second transistor, the third transistor, and the seventh transistor to be turned off, controlling, by the second clock signal, the fifth transistor to be turned on, and transmitting, by the sixth transistor, the first voltage signal to the signal output terminal.

Another aspect of the present disclosure provides a display panel including a shift register circuit. The shift register circuit comprises a first transistor, a second transistor, a third transistor, a fourth transistor, a fifth transistor, a sixth transistor, a seventh transistor, a first capacitor, and a second capacitor. The first transistor is configured to be turned on in response to a voltage signal at a first node, thereby providing an input signal to a second node. The second transistor is configured to be turned on in response to a first clock signal, thereby providing the input signal to the first node. The third transistor is configured to be turned on in response to the first clock signal, thereby providing a charging signal to a second node. The fourth transistor is configured to be turned on in response to a voltage signal at the second node, thereby providing a first voltage signal to a third node. The fifth transistor is configured to be turned on in response to a second clock signal, thereby providing a voltage signal at the third node to the first node. The sixth transistor is configured to be turned on in response to the voltage signal at the second node, thereby providing the first voltage signal to a signal output terminal. The seventh transistor is configured to be turned on in response to a voltage signal at a fourth node, thereby providing the second clock signal to the signal output terminal, wherein the voltage at the fourth node is positively correlated to the voltage at the first node. The first capacitor is electrically connected between the fourth node and the signal output terminal, and the second capacitor is electrically connected between the second node and the first voltage signal.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated into and constitute a part of this specification, illustrate one or more embodiments of the present disclosure and, together with the detailed description, serve to explain the principles and implementations of the disclosure. Apparently, the drawings described below only correspond to some embodiments of the present disclosure, and it is possible for those ordinarily skilled in the art to derive other drawings from the accompanying drawings without creative effort.

DETAILED DESCRIPTION

Figure 1A:
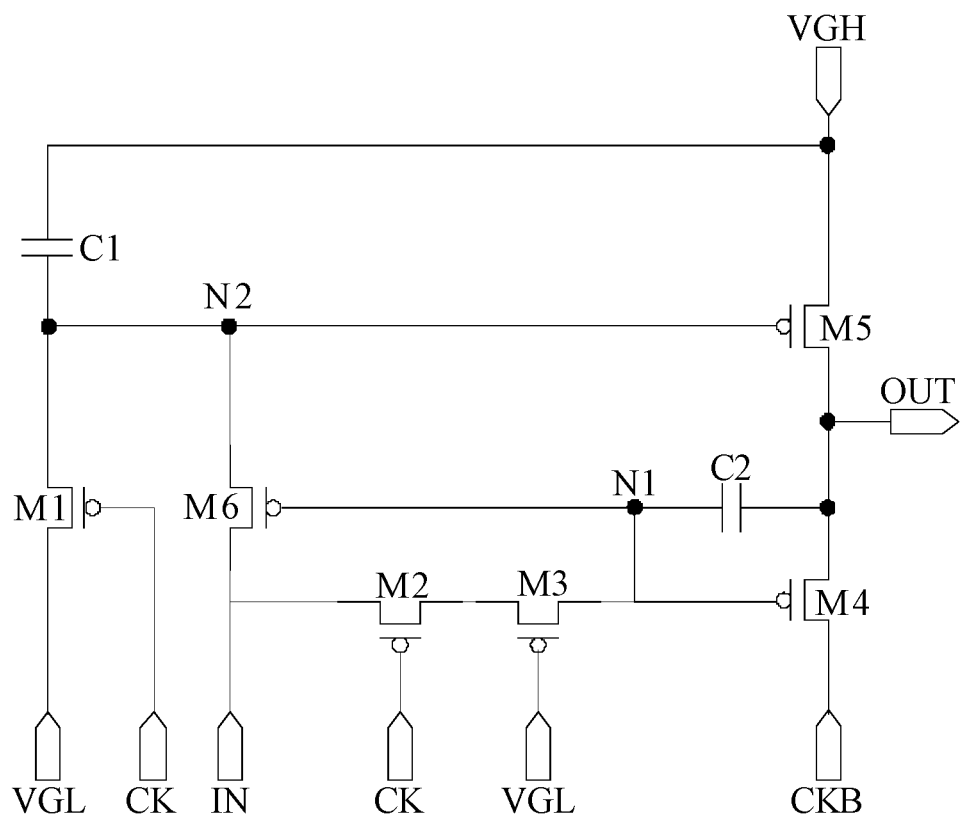
FIG. 1A illustrates an existing circuit diagram of a shift register circuit.
Figure 1B:
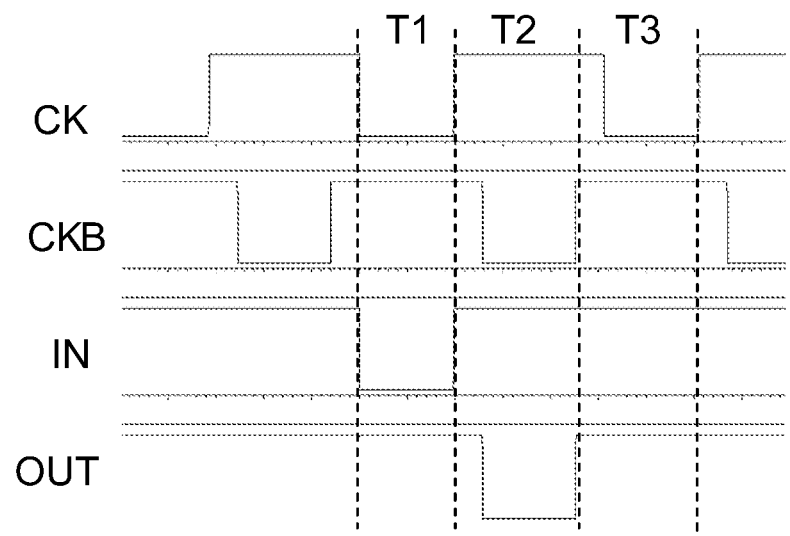
FIG. 1B illustrates a control timing sequence diagram of a shift register circuit in FIG. 1A.

Exemplary embodiments will be described more fully hereinafter with reference to accompanying drawings. However, embodiments of the present disclosure may be implemented in many different forms and should not be construed as being limited to the embodiments set forth herein. Rather, these embodiments are provided so that the present disclosure will be more thorough and complete, and will fully convey the scope of the exemplary embodiments to those skilled in the art. The described features, structures, or characteristics may be combined in any suitable manner in one or more embodiments. In the following description, numerous specific details are given to provide a thorough understanding of embodiments of the present disclosure. Those skilled in the relevant art will recognize, however, that technical solutions of the present disclosure can be practiced without one or more of the specific details, or with other methods, components, devices, or steps, etc. In other instances, well-known technical solutions are not shown or described in detail to avoid obscuring aspects of the present disclosure.

In addition, the accompanying drawings of the present disclosure are only schematic, like reference numerals in the drawings denote same or like elements, and thus repeated description thereof will be omitted. Certain block diagrams illustrated in accompanying drawings are functional entities, and may not necessarily correspond to physically or logically independent entities. These functional entities may be implemented by means of software, or one or more hardware modules or an integrated circuit. Or, these functional entities may be implemented in different networks and/or processer devices and/or microcontroller devices.

Figure 2:
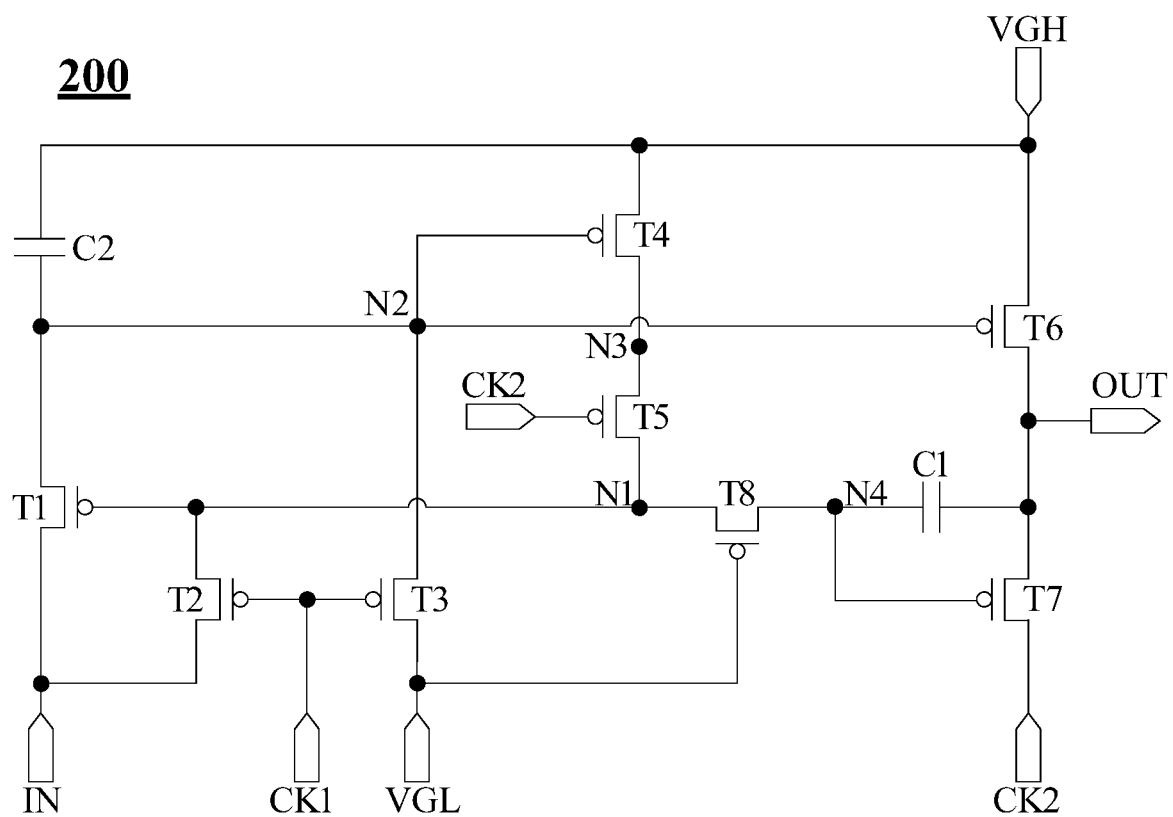
FIG. 2 illustrates an exemplary circuit diagram of a shift register circuit according to embodiments of the present disclosure.

Exemplary embodiments of the present disclosure will be described in detail hereinafter with reference to the accompanying drawings. FIG. 2 illustrates an exemplary circuit diagram of a shift register circuit according to embodiments of the present disclosure. As shown in FIG. 2, a shift register circuit 200 may include first to seventh transistors T1~T7, a first capacitor C1, and a second capacitor C2. Optionally, the shift register circuit 200 may further include an eighth transistor T8.

More specifically, the first transistor T1 may be turned on in response to a voltage signal at a first node N1. A second transistor T2 may be turned on in response to a first clock signal CK1, thereby providing an input signal IN (also referred to as V(IN)) to the first node N1. A third transistor T3 may be turned on in response to the first clock signal CK1, thereby providing a charging signal (e.g. a second voltage signal VGL) to a second node N2. A fourth transistor T4 may be turned on in response to a voltage signal at the second node N2, thereby providing a first voltage signal VGH to a third node N3.

Further, a fifth transistor T5 may be turned on in response to a second clock signal CK2, thereby providing a voltage signal at the third node N3 to the first node N1. A sixth transistor T6 may be turned on in response to a voltage signal at the second node N2, thereby providing the first voltage signal VGH to a signal output terminal OUT. A seventh transistor T7 may be turned on in response to a voltage signal at a fourth node N4, thereby providing the second clock signal CK2 to the signal output terminal OUT.

Further, the eighth transistor T8 may be turned on in response to the second voltage signal VGL, thereby electrically connecting the first node N1 and the fourth node N4. The voltage at the fourth node N4 may be positively correlated to the voltage at the first node N1. By configuring the eighth transistor T8, the relatively large crossing voltage occurred in the operation of the circuit may be reduced, thereby improving the reliability of the circuit.

Further, the eighth transistor T8 may implement a circuit-protecting function. For example, the eighth transistor T8 may be a resistor of a predetermined resistance, and the present disclosure is not limited thereto. Optionally, in some embodiments, the first node N1 and the fourth node N4 may be the same node. That is, the eighth transistor T8 may not be configured.

Further, the first capacitor C1 may be electrically connected between the fourth node N4 and the signal output terminal OUT. The second capacitor C2 may be electrically connected to the second node N2 and the first voltage signal VGH.

More specifically, the first transistor T1 to the seventh transistor T7 may each include a control end, a first end, and a second end. As shown in FIG. 2, when diagramed, the first end and the second end of a transistor may be drawn connected by a plate, and the control end may be drawn connected to a plate in parallel with the plate connecting the first end and the second end. P-type transistors may be indicated by a circle connecting the control end to a corresponding plate, while N-type transistors have no such cycle.

In one embodiment, as shown in FIG. 2, the first transistor T1 to the seventh transistor T7 may all be P-type transistors for illustrative purposes. Further, the control end may be a gate electrode of the transistor, the first end may be a source electrode of the transistor, and the second end may be a drain electrode of the transistor. Because in a thin film transistor, the source electrode and the drain electrode may not be differentiated strictly, in some other embodiments, the first end may be the drain electrode of the transistor and the second end may be the drain electrode of the transistor.

Referring to FIG. 2, the control end of the first transistor T1 may be electrically connected to the first node N1, the first end of the first transistor T1 may receive the input signal IN, and the second end of the first transistor T1 may be electrically connected to the second node N2. The control end of the second transistor T2 may receive the first clock signal CK1, the first end of the second transistor T2 may receive the input signal IN, and the second end of the second transistor may be electrically connected to the first node N1.

Further, the control end of the third transistor T3 may receive the first clock signal CK1, the first end of the third transistor T3 may receive a charging signal (e.g., the second voltage signal VGL), and the second end of the third transistor T3 may be electrically connected to the second node N2. The control end of the fourth transistor T4 may be electrically connected to the second node N2, the first end of the fourth transistor T4 may receive the first voltage signal VGH, and the second end of the fourth transistor T4 may be electrically connected to the third node N3 or optionally to the first end of the fifth transistor T5.

Further, the control end of the fifth transistor T5 may receive the second clock signal CK2, the first end of the fifth transistor T5 may be electrically connected to the third node N3 or optionally to the second end of the fourth transistor T4, and the second end of the fifth transistor T5 may be electrically connected to the first node N1. The control end of the sixth transistor T6 may be electrically connected to the second node N2, the first end of the sixth transistor T6 may receive the first voltage signal VGH, and the second end of the sixth transistor T6 may be electrically connected to the signal output terminal OUT. The control end of the seventh transistor T7 may be electrically connected to the fourth node N4, the first end of the seventh transistor T7 may receive the second clock signal CK2, and the second seventh transistor T7 may be electrically connected to the signal output terminal OUT.

Further, the eighth transistor T8 may also include a control end, a first end, and a second end. The control end may be a gate electrode of the eighth transistor T8, the first end may be the source electrode of the eighth transistor T8, and the second end may be the drain electrode of the eighth transistor T8. Optionally, the first end may be the drain electrode of the eighth transistor T8, and the second end may be the source electrode of the eighth transistor T8.

In one embodiment, as shown in FIG. 2, the eighth transistor T8 may also be a P-type transistor. The control end of the eighth transistor T8 may receive a charging signal (e.g., the second voltage signal VGL), the first end of the eighth transistor T8 may be connected to the first node N1, and the second end of the eighth transistor T8 may be connected to the fourth node N4.

In one embodiment, the charging signal may be the second voltage signal VGL, and the present disclosure is not limited thereto. For example, in another embodiment, the charging signal may be the first clock signal CK1, or second clock signal CK2, etc.

Figure 3:
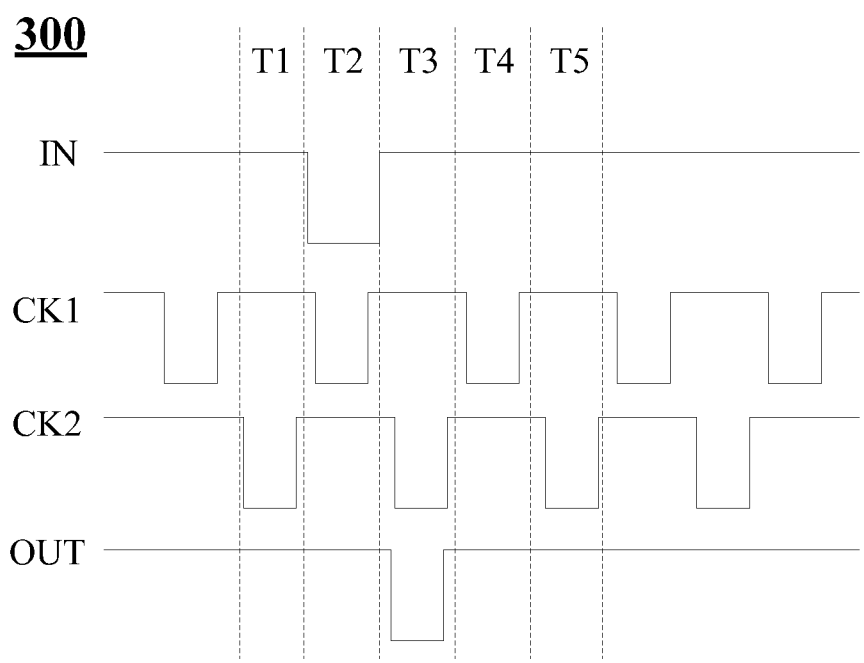
FIG. 3 illustrates an exemplary control timing sequence of a shift register circuit in FIG. 2.

FIG. 3 illustrates an exemplary control timing sequence 300 of a shift register circuit in FIG. 2. As shown in FIG. 3, voltage levels of the input signal IN, the first clock signal CK1, the second clock signal CK2, and the output signal OUT (also referred as VOUT, or V(OUT)) in five stages (t1~t5) are illustrated.

As shown in FIG. 3, in one embodiment, low-voltage duty cycle of the first clock signal CK1 and the second clock signal CK2 may be both lower than ½, and the first clock signal CK1 and the second clock signal CK2 may differ by ½ signal cycle. The low-voltage duty cycle (hereinafter referred to as "duty cycle") may refer to a percentage of period in which a signal is at a low voltage level. In some other embodiments, high-voltage duty cycle of the first clock signal CK1 and the second clock signal CK2 may be both lower than ½, and the first clock signal CK1 and the second clock signal CK2 may differ by ½ signal period. The high-voltage duty cycle may refer to a percentage of period in which a signal is at a high voltage level.

In practical applications, because a RC load may exist during operation of the circuit, the first clock signal CK1 and the second clock signal CK2 may have delays. If the duty cycle is ½ or higher, the clock signal delay may result in abnormal operation of the circuit. When the number of cascaded shift register circuits in the circuit is relatively large, the whole circuit may fail. Accordingly, embodiments of the present disclosure may configure the duty cycle of the first clock signal CK1 and the second clock signal CK2 to be lower than or equal to ½.

FIG. 4A~FIG. 4E illustrate equivalent circuit diagrams of a shift register circuit in FIG. 2 in each stage of a control timing sequence in FIG. 3. As shown in FIG. 4A~FIG. 4E, the first transistor T1 to the eighth transistor T8 may all be p-type transistors. When all the transistors (T1~T8) are P-type transistors, the first voltage signal VGH may be a high voltage level signal, and the second voltage signal VGL may be a low voltage level signal. Further, a P-type transistor may be turned on when a low voltage level is applied to the control end (i.e., gate electrode) of the transistor, and may be turned off when a high voltage level is applied to the control end of the transistor.

Figure 4A:
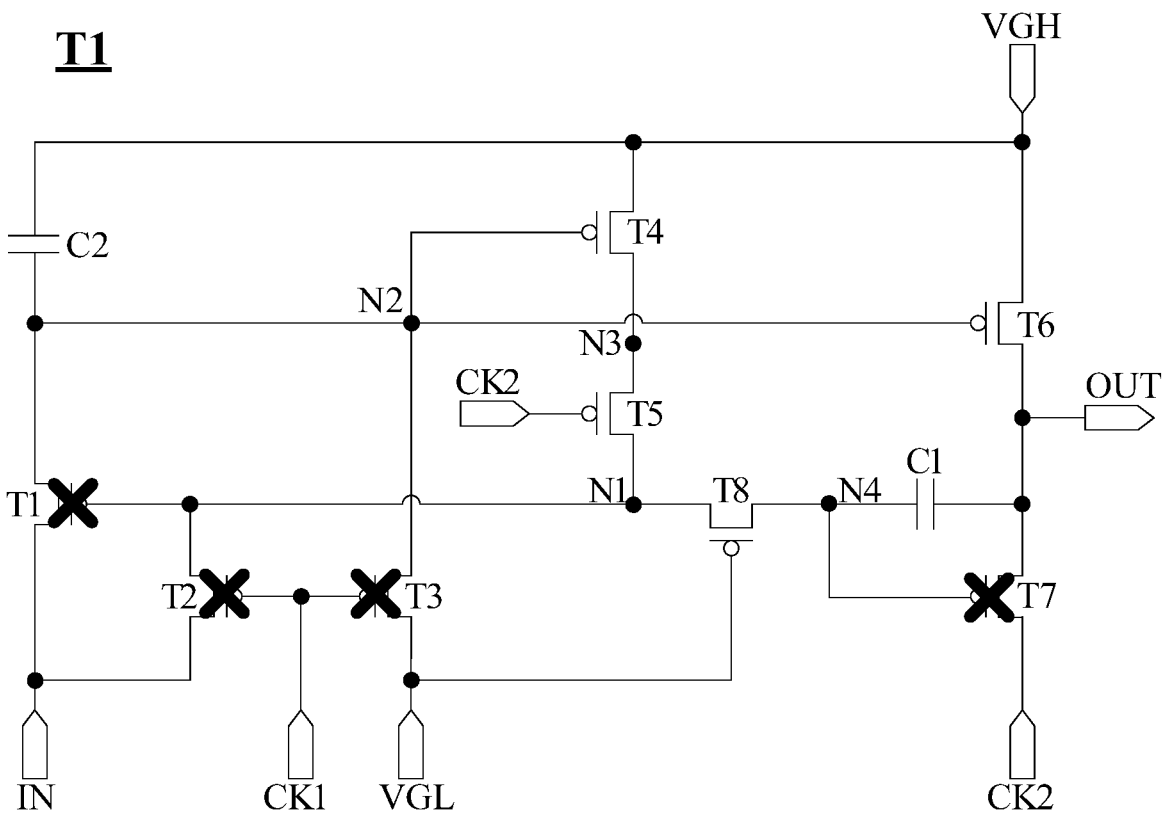
FIG. 4A~FIG. 4E illustrate equivalent circuit diagrams of a shift register circuit in FIG. 2 under each stage of a control timing sequence in FIG. 3.

FIG. 4A illustrates an equivalent circuit diagram of a shift register circuit in a first stage t1 of a control timing sequence in FIG. 3. As shown in FIG. 4A and referring to FIG. 3, in the first stage t1, the first clock signal CK1 and the input signal IN may be both at a high voltage level, thereby controlling the second transistor T2 and the third transistor T3 to be turned off. The second clock signal CK2 may be at a low voltage level, thereby controlling the fifth transistor T5 to be turned on. By then, because of the storage function of the second capacitor C2, the second node N2 may maintain a low voltage from a previous moment and the first node N1 may maintain a high voltage from a previous moment. Accordingly, the fourth transistor T4 and the sixth transistor T6 may be continuously turned on.

Further, via the fourth transistor T4 and the fifth transistor T5, the high voltage level of the first voltage signal VGH may be transmitted to the first node N1, thereby realizing active maintenance of the high voltage level at the first node N1. The high voltage level at the first node N1 may control the first transistor T1 to be turned off. Further, because of the low voltage level of the second voltage signal VGL, the eighth transistor T8 may be continuously turned on, and thus the high voltage level at the first node N1 may be transmitted to the fourth node N4, thereby controlling the seventh transistor T7 to be turned off.

Accordingly, when the first voltage signal VGH is transmitted to the signal output terminal OUT via the sixth transistor T6 and the circuit thus outputs a high voltage level, the low voltage level of the second clock signal CK2 may not be able to affect the first node N1 via the parasitic capacitance of the seventh transistor T7. The high voltage level of the output signal OUT may thus be outputted stably.

Figure 4B:
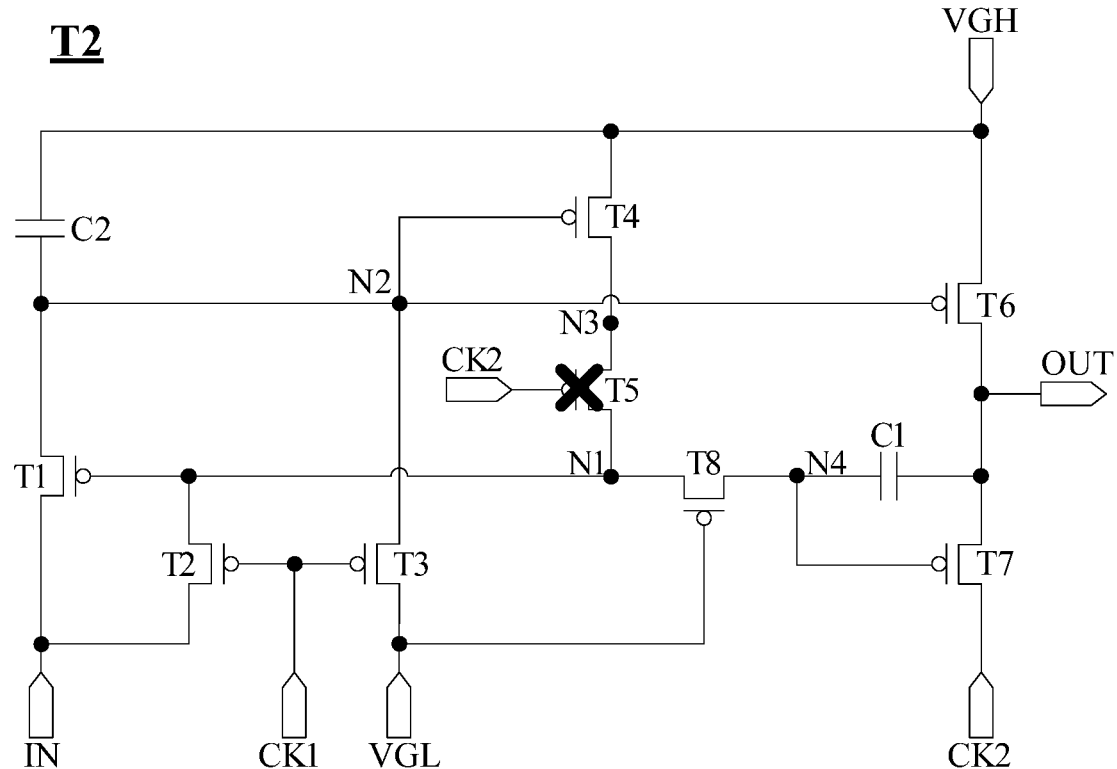

FIG. 4B illustrates an equivalent circuit diagram of a shift register circuit in a second stage t2 of a control timing sequence in FIG. 3. As shown in FIG. 4B and referring to FIG. 3, in the second stage t2, the first clock signal CK1, the input signal IN may be both at a low voltage level, thereby controlling the first transistor T1, the second transistor T2, the third transistor T3, the fourth transistor T4, the sixth transistor T6, and the seventh transistor T7 to be turned on. The second clock signal CK2 may be at a high voltage level, thereby controlling the fifth transistor T5 to be turned off.

By then, the low voltage level of the input signal IN may be transmitted to the first node N1 via the second transistor T2, such that the first node N1 may change to a low voltage level. The low voltage may be stored in the first capacitor C1. Further, the low voltage level of the first node N1 may be applied onto the gate electrode of the first transistor T1, thus allowing the low voltage level of the input signal IN to be transmitted to the second node N2. Simultaneously, the third transistor T3 may transmit the low voltage level of the second voltage signal VGL to the second node N2, thereby realizing active maintenance of a low voltage level at the second node N2.

Further, the first voltage signal VGH may be transmitted to the signal output terminal OUT via the sixth transistor T6, and the circuit may thus output a high voltage level. Because the low voltage level at the first node N1 and the second node N2 are both maintained by an active source, the high voltage level of the second clock signal CK2 may not be able to affect the first node N1 via the parasitic capacitance of the seventh transistor T7 or affect the second node N2 via the parasitic capacitance of the sixth transistor T6. Accordingly, the high voltage level of the output signal OUT may be outputted stably.

Figure 4C:
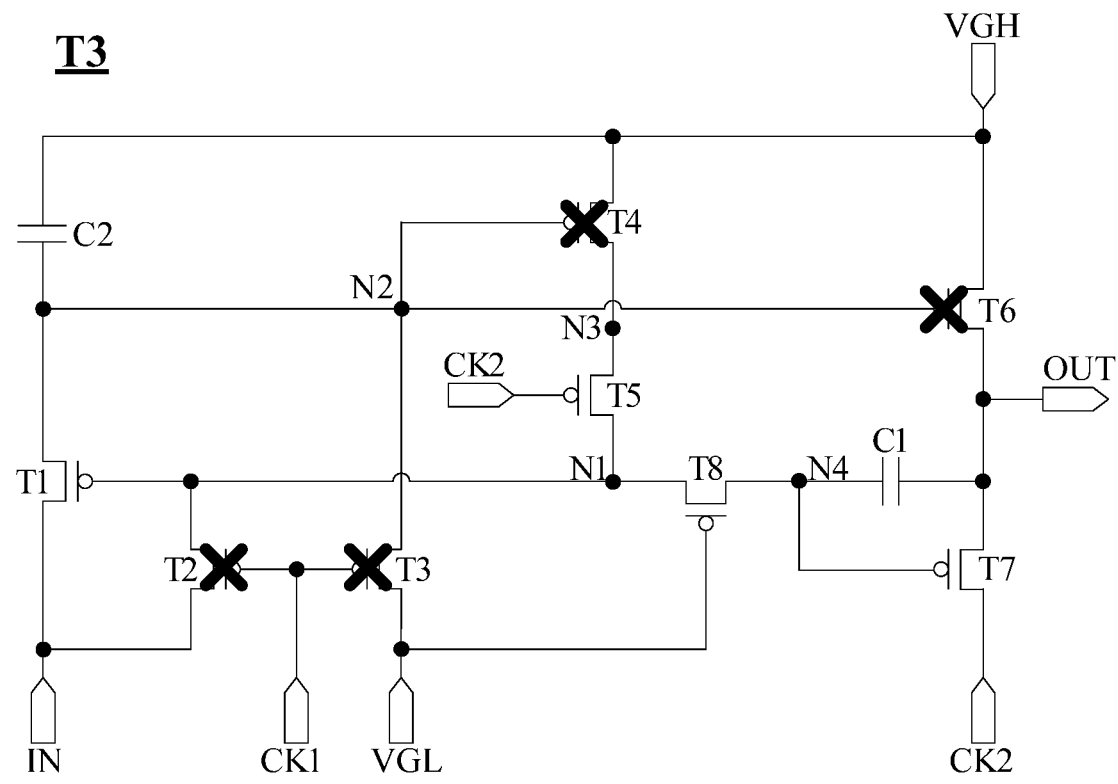

FIG. 4C illustrates an equivalent circuit diagram of a shift register circuit in a third stage t3 of a control timing sequence in FIG. 3. As shown in FIG. 4C and referring to FIG. 3, in the third stage t3, the first clock signal CK1 and the input signal IN may be both at a high voltage level, thereby controlling the second transistor T2, the third transistor T3, the fourth transistor T4, and the sixth transistor T6 to be turned off. The second clock signal CK2 may be at a low voltage level, thereby controlling the fifth transistor T5 to be turned on.

By then, due to the low voltage level stored by the first capacitor C1 in the second stage t2, the first node N1 may remain a low voltage level, such that the first transistor T1 and the seventh transistor T7 may be continuously turned on. The high voltage level of the input signal IN may thus be transmitted to the second node N2 via the first transistor T1, such that the second node N2 may change into a high voltage level.

Further, the second clock signal CK2 may be transmitted to the signal output terminal OUT via the seventh transistor T7 to output a low voltage level. The voltage level of the first node N1 may become lower because of the low voltage level of the second clock signal CK2 via the coupling effect of parasitic capacitance of the seventh transistor T7. Accordingly, the low voltage level of the second clock signal CK2 may be outputted stably.

Figure 4D:
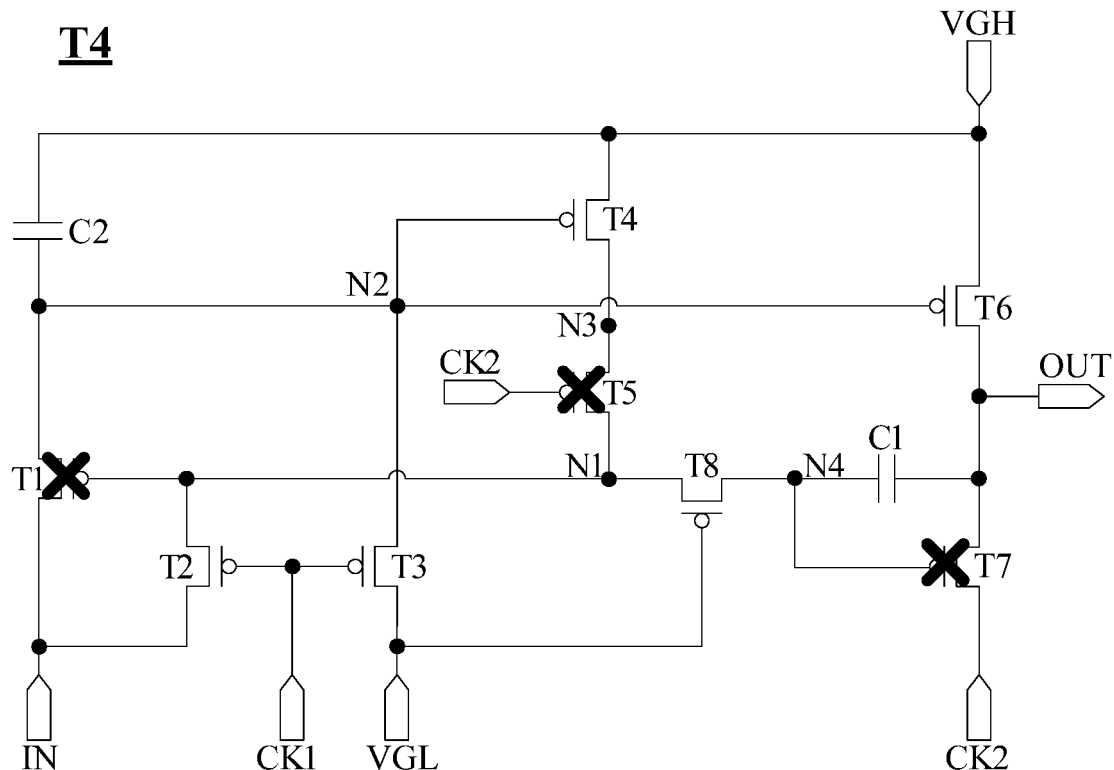

FIG. 4D illustrates an equivalent circuit diagram of a shift register circuit in a fourth stage t4 of a control timing sequence 300 in FIG. 3. As shown in FIG. 4D and referring to FIG. 3, in the fourth stage t4, the first clock signal CK1 may be at a low voltage level, thereby controlling the second transistor T2 and the third transistor T3 to be turned on. The input signal IN and the second clock signal CK2 may be both at a high voltage level, thereby controlling the first transistor T1, the seventh transistor T7, and the fifth transistor T5 to be turned off.

By then, the high voltage level of the input signal IN may be transmitted to the first node N1 via the second transistor T2, such that the first node N1 may be at a high voltage level. Simultaneously, the low voltage level of the second voltage signal VGL may be transmitted to the second node N2 via the third transistor T3, thereby realizing active maintenance of a low voltage level at the second node N2. The second capacitor C2 may store the low voltage level. The first voltage signal VGH may be transmitted to the signal output terminal OUT via the sixth transistor T6, and the high voltage level of the output signal OUT may be stably outputted.

Figure 4E:
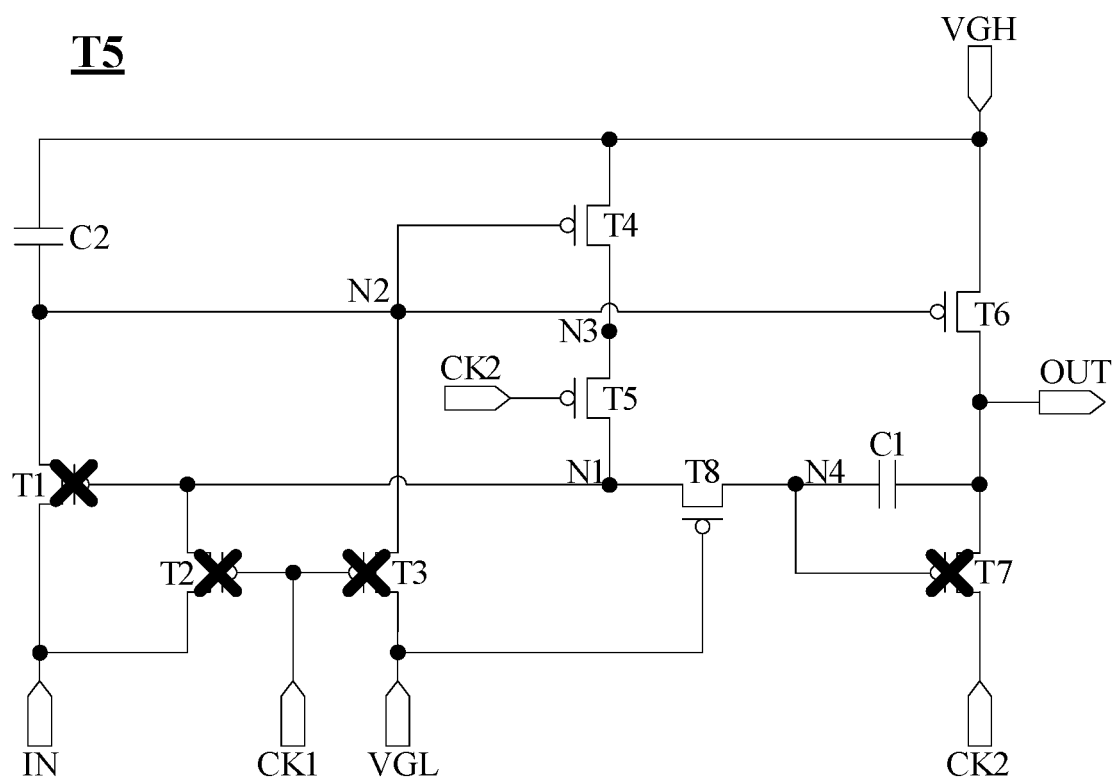

FIG. 4E illustrates an equivalent circuit diagram of a shift register circuit in a fifth stage t5 of a control timing sequence 300 according to embodiments of the present disclosure. As shown in FIG. 4E and referring to FIG. 3, in the fifth stage t5, the first clock signal CK1 and the input signal IN may be both at a high voltage level, thereby controlling the second transistor T2, the third transistor T3, the first transistor T1, and the seventh transistor T7 to be turned off. The second clock signal CK2 may be a low voltage level, thereby controlling the fifth transistor T5 to be turned on.

By then, due to the storage effect of the second capacitor C2, the second node N2 may maintain the low voltage level from the previous state (i.e., stage t4), thereby controlling the fourth transistor T4 and the sixth transistor T6 to be turned on. The high voltage level of the first voltage signal VGH may be transmitted to the first node N1 via the fourth transistor T4 and the fifth transistor T5 to set the first node N1 to be continuously at a high voltage level, thereby realizing active maintenance of the high voltage level at the first node N1.

Accordingly, the transition of the second clock signal CK2 from a high voltage level to a low voltage level may not affect the high voltage level at the first node N1 via the coupling effect of the parasitic capacitance of the seventh transistor T7, and the cut-off state of the seventh transistor T7 may not be affected. The first voltage signal VGH may be transmitted to the signal output terminal OUT via the sixth transistor T6, and the high voltage level of the output signal OUT may be outputted stably.

From aforementioned descriptions, the disclosed shift register circuit may realize maintenance of active input of voltage levels to the first node N1 and the second node N2, and reduce the impact of the abrupt variation of the second clock signal CK2 via the coupling effect of the parasitic capacitance on the first node N1 and the second node N2. Accordingly, the output signal OUT may be outputted stably.

Figure 5:
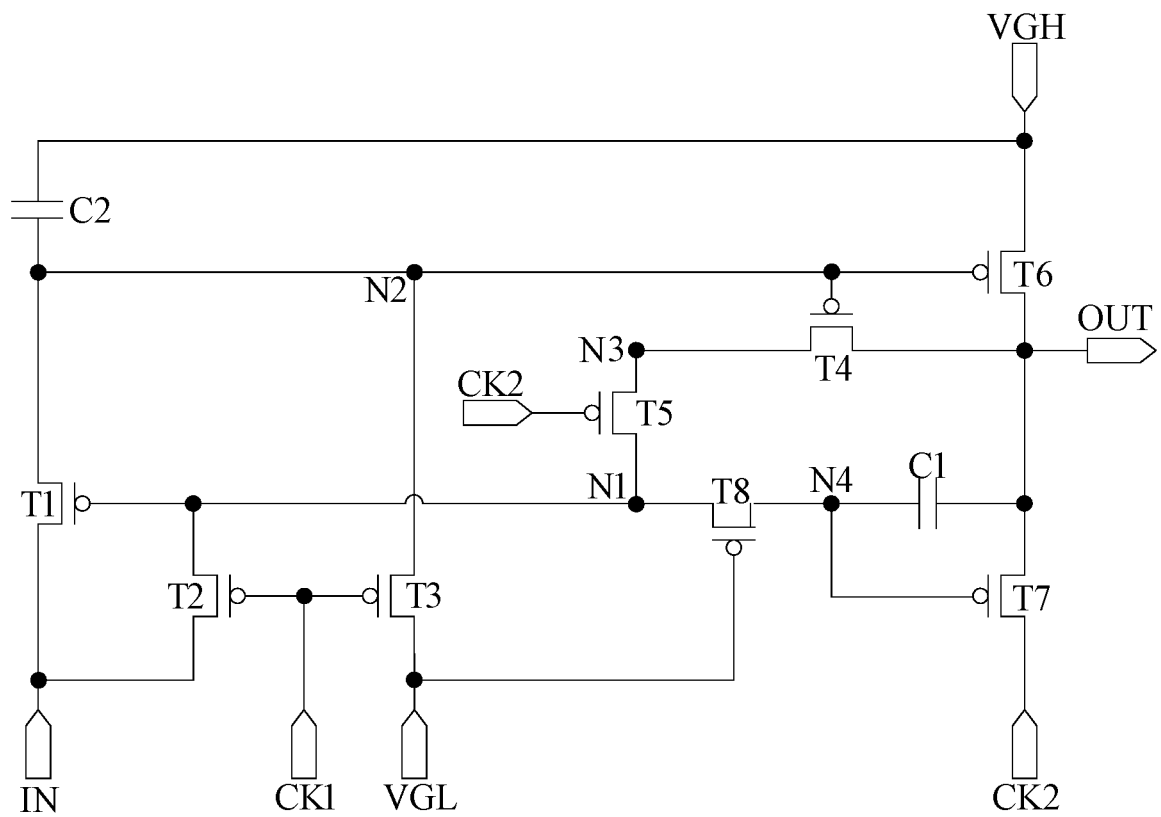
FIG. 5 illustrates another exemplary circuit diagram of a shift register circuit according to embodiments of the present disclosure.

Further, the present disclosure also provides another connection method of a shift register circuit. FIG. 5 illustrates another exemplary circuit diagram of a shift register circuit 200 according to embodiments of the present disclosure. As shown in FIG. 5, in one embodiment, the control end of the first transistor T1 may be electrically connected to the first node N1, the first end of the first transistor T1 may receive the input signal IN, and the second end of the first transistor T1 may be electrically connected to the second node N2.

Further, the control end of the second transistor T2 may receive the first clock signal CK1, the first end of the second transistor may receive the input signal IN, and the second end of the second transistor T2 may be electrically connected to the first node N1. The control end of the third transistor T3 may receive the first clock signal CK1, the first end of the third transistor T3 may receive a charging signal (i.e., the second voltage signal VGL), and the second end of the third transistor T3 may be electrically connected to the second node N2.

The control end of the fourth transistor T4 may be electrically connected to the second node N2, the first end of the fourth transistor T4 may be electrically connected to the signal output terminal OUT, and the second end of the fourth transistor T4 may be electrically connected to the third node N3 or the first end of the fifth transistor T5. The control end of the fifth transistor T5 may receive the second clock signal CK2, the first end of the fifth transistor T5 may be electrically connected to the third node N3 or the second end of the fourth transistor T4, and the second end of the fifth transistor T5 may be electrically to the first node N1.

Further, the control end of the sixth transistor T6 may be electrically connected to the second node N2, the first end of the sixth transistor T6 may receive the first voltage signal VGH, and the second end of the sixth transistor T6 may be electrically connected to the signal output terminal OUT. The control end of the seventh transistor T7 may be electrically connected to the fourth node N4, the first end of the seventh transistor T7 may receive the second clock signal CK2, and the second end of the seventh transistor T7 may be electrically connected to the signal output terminal OUT.

Further, the control end of the eighth transistor T8 may receive a charging signal (i.e., the second voltage signal VGL), the first end of the eighth transistor T8 may be electrically connected to the first node N1, and the second end of the eighth transistor T8 may be electrically connected to the fourth node N4. The first capacitor C1 may be electrically connected between the fourth node N4 and the signal output terminal OUT. The second capacitor C2 may be electrically connected to the second node N2 and the first voltage signal VGH.

The shift register circuit illustrated in FIG. 5 has a similar configuration to the aforementioned shift register circuit 200. Accordingly, with reference to the descriptions of each stage of a control timing sequence for the shift register circuit 200, those skilled in the art may obtain each stage of a control timing sequence for the shift register circuit illustrated in FIG. 5.

In the aforementioned circuit, the first node N1 and the fourth node N4 may be the same node, or may be connected to a first end and a second end of an eighth transistor T8. As shown in FIG. 5, the eighth transistor T8 may be turned on in response to the second voltage signal VGL, thereby electrically connecting the first node N1 and the fourth node N4. Via the eighth transistor T8, the relatively large crossing voltage existing in the operation of the circuit may be reduced, thereby improving the reliability of the circuit. Further, the eighth transistor T8 may implement a circuit-protecting function in other manners. For example, the eighth transistor T8 may be a resistor of a predetermined resistance, and the present disclosure is not limited thereto.

Further, in one embodiment, the charging signal may be the second voltage signal VGL. In other embodiments, the charging signal may also be the first clock signal CK1, or the second clock signal CK2, etc.

Figure 6:
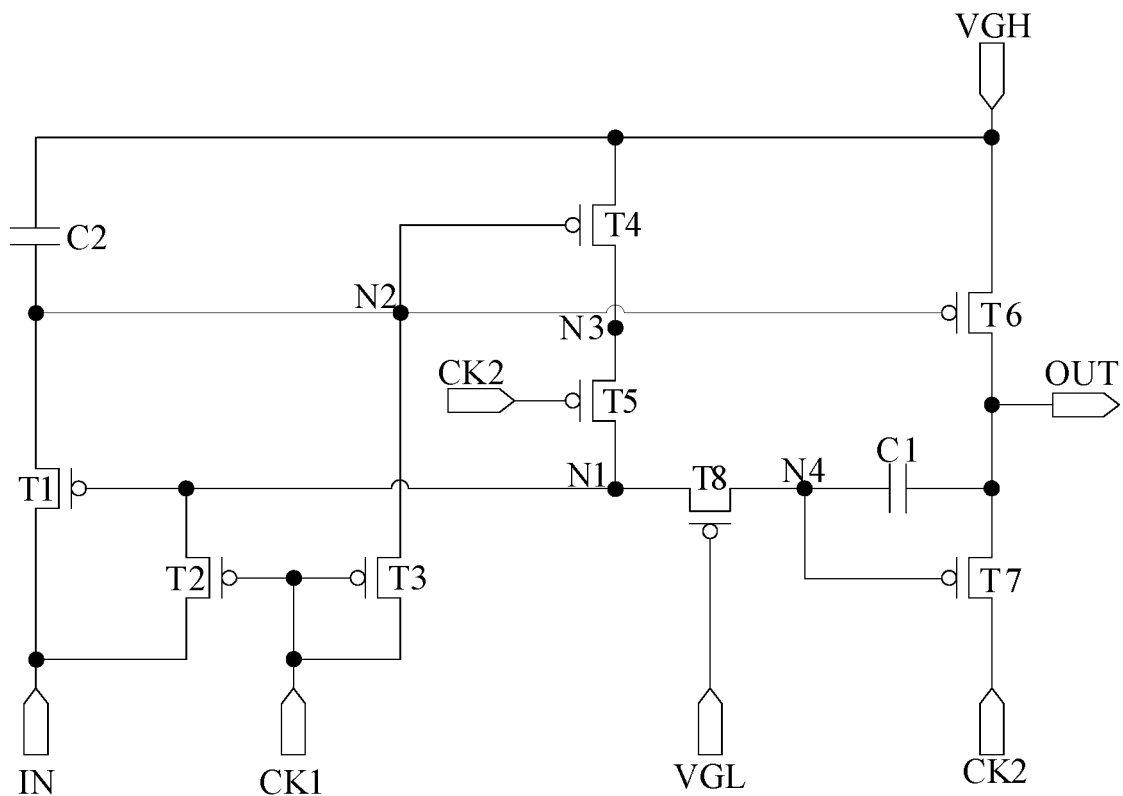
FIG. 6 illustrates another exemplary circuit diagram of a shift register circuit according to embodiments of the present disclosure.
Figure 7:
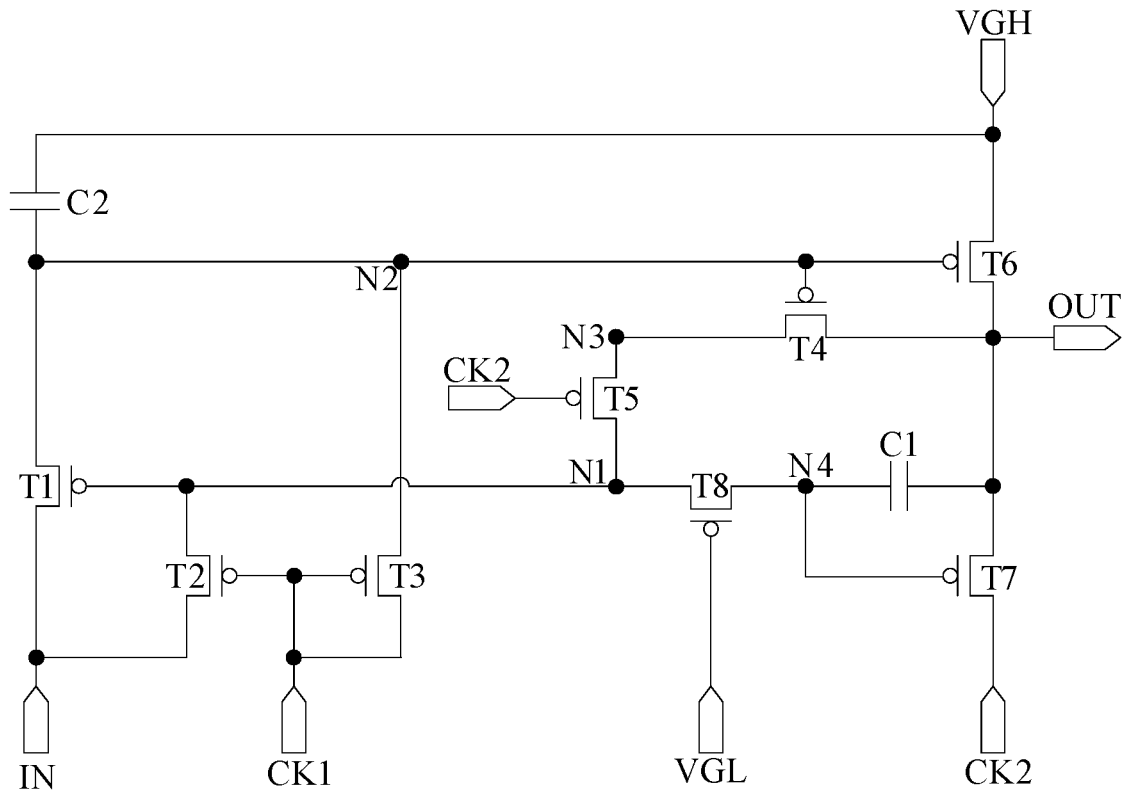
FIG. 7 illustrates another exemplary circuit diagram of a shift register circuit according to embodiments of the present disclosure.

FIG. 6 illustrates another exemplary circuit diagram of a shift register circuit according to embodiments of the present disclosure. FIG. 7 illustrates another exemplary circuit diagram of a shift register circuit according to embodiments of the present disclosure. FIG. 6 and FIG. 7 each illustrates an exemplary circuit diagram of a shift register circuit where the charging signal is a first clock signal CK1. The shift register circuit illustrated in FIG. 6 may correspond to a shift register circuit illustrated in FIG. 2, and the shift register circuit illustrated in FIG. 7 may correspond to a shift register circuit illustrated in FIG. 5.

That is, FIG. 6 and FIG. 7 only provide shift register circuits showing simple variations with respect to the shift register circuits illustrate in FIG. 2 and FIG. 5, respectively, and the voltage level at each node in each stage of the timing sequence for the shift register circuits may not be affected.

More specifically, different from FIG. 2, instead of receiving the second voltage signal VGL, the first end of the third transistor T3 illustrated in FIG. 6 may receive the first clock signal CK1. Similarly, different from FIG. 5, instead of receiving the second voltage signal VGL, the first end of the third transistor T3 illustrated in FIG. 7 may receive the first clock signal CK1. Other components remain basically similar or the same, and are not described repetitively.

Figure 8A:
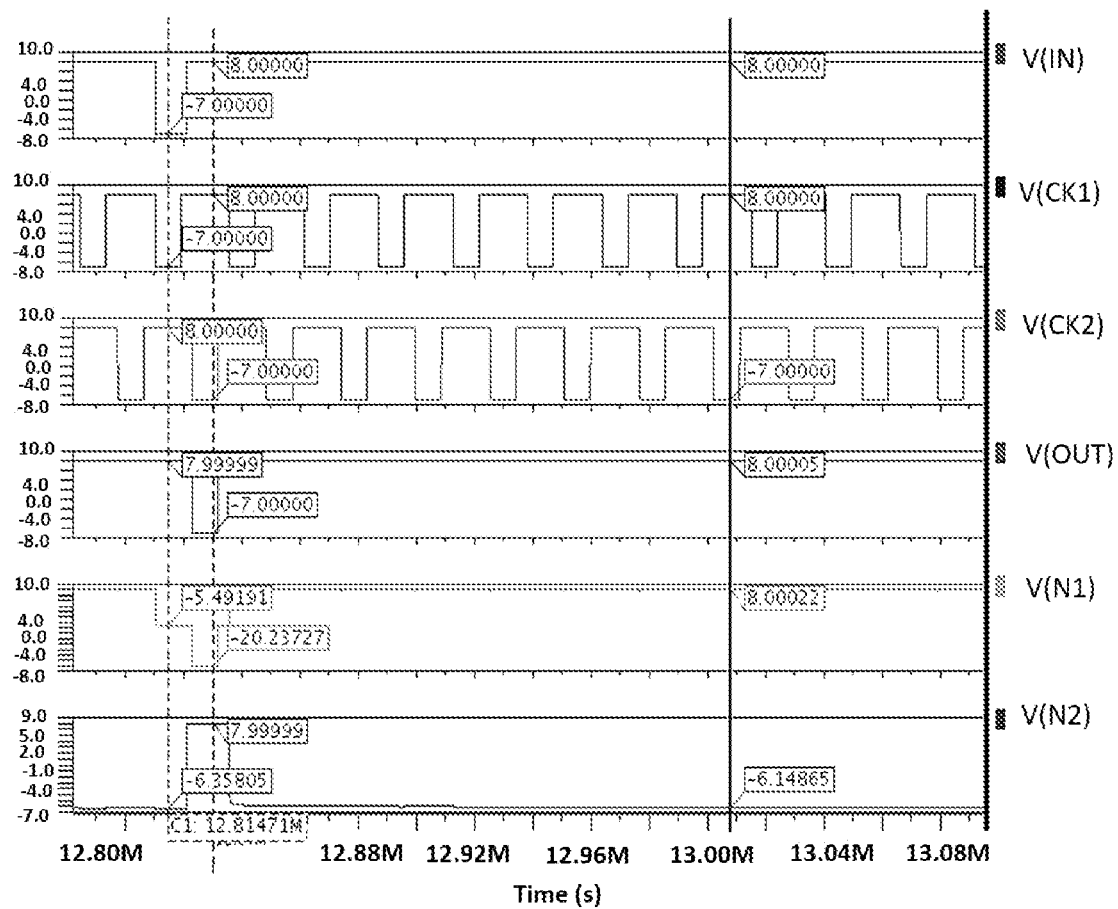
FIGS. 8A-8C illustrate exemplary working data of shift register circuits according to embodiments of the present disclosure.
Figure 8B:
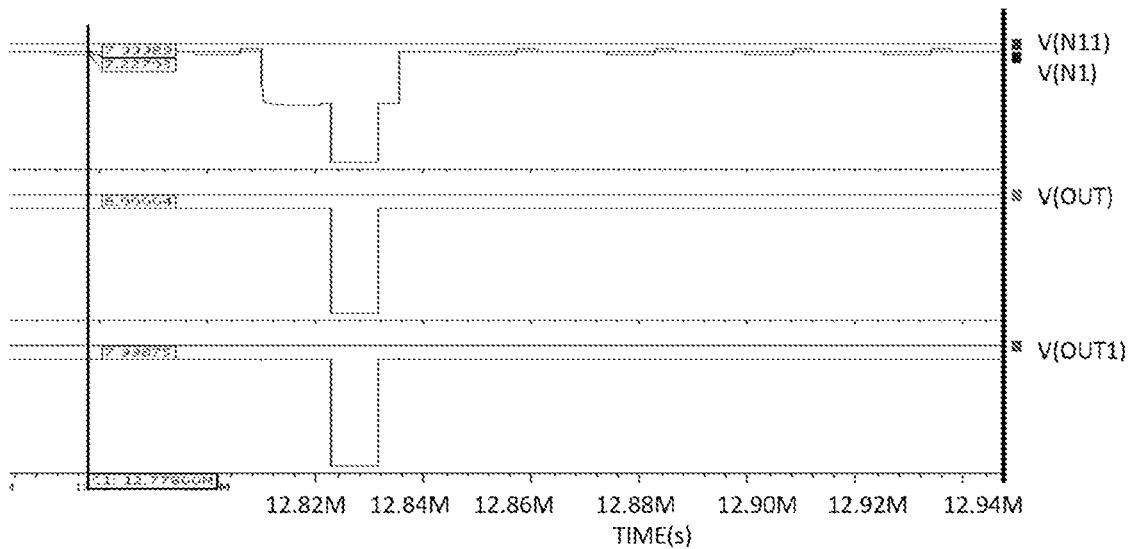
Figure 8C:
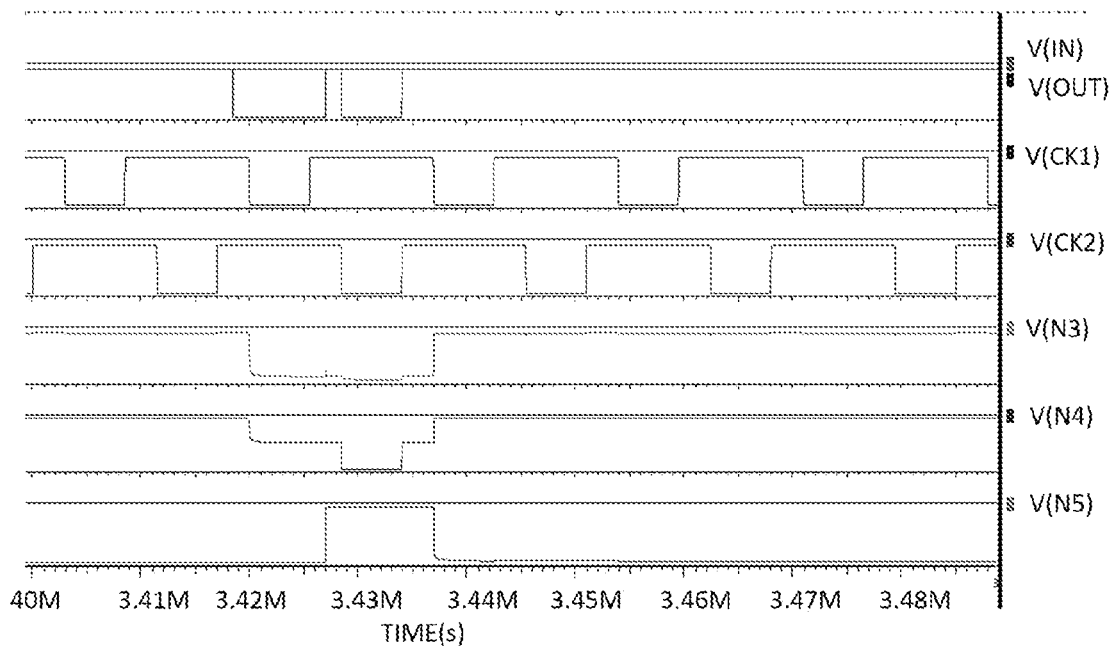

FIGS. 8A-8C illustrate exemplary working data of shift register circuits according to embodiments of the present disclosure. In particular, FIG. 8A corresponds to an exemplary timing sequence of a shift register circuit 200 in FIG. 3. Different from FIG. 3, the timing sequence in FIG. 8A further illustrate the variation of voltage level V(N1) at the first node N1 and the variation of the voltage level V(N2) at the second node N2. As shown in FIG. 8A, the voltage level V(N1) at the first node N1 and the voltage level V(N2) at the second node N2 may be relatively stable, and the output voltage level V(OUT) may be also relatively stable.

In one embodiment, referring to FIG. 8A, in an operational process of a shift register circuit 200, the disclosed high voltage level in the aforementioned embodiments may be approximately 8V, and the disclosed low voltage level in the aforementioned embodiments may be approximately −7V. Further, the output voltage level V(OUT) may be stabilized at approximately 8V.

FIG. 8B illustrate variations in a voltage level at an existing first node N11 and variation in a voltage level at an exemplary first node N1 according to embodiments of the present disclosure. More specifically, as shown in FIG. 8B, V(N11) is a voltage level at an existing first node N11 when a parasitic capacitance of 2f is simulated between the first node N1 and the second clock signal CK2, and V(N1) is a voltage level at the first node N1 in aforementioned embodiments.

When the parasitic capacitance between the first node N11 and the second clock signal CK2 is 2f, the second clock signal CK2 may have a relatively large impact on the low voltage level at the first node N11. The fluctuation in the voltage level at the first node N1 may be, however, relatively small, and may further be a positive fluctuation (i.e., the voltage level is slightly increased). Accordingly, the fluctuation in the voltage level at the first node N1 may have a relatively small impact on the output signal of the circuit. In an actual circuit, the parasitic capacitance may be greater than the simulation parasitic capacitance 2*f*.

Referring to FIG. 8C, the output waveform of the shift register circuit illustrated in FIG. 5, FIG. 6, and FIG. 7 may be basically the same as the output waveform of the shift register circuit in FIG. 2. Accordingly, the aforementioned different connection manners may not affect the unity of the technical solutions of the present disclosure.

In the aforementioned embodiments, the transistors may all be P-type transistors. However, those skilled in the relevant art may easily conclude that the disclosed shift register circuit may also be a shift register circuit including all N-type transistors. Using all P-type thin film transistors may have advantages such as a strong noise-resistant ability. For example, because of the P-type transistors may be turned on when the gate electrode receives a relatively low voltage level, the low voltage level may be implemented relatively easily in charging management, and the disclosed shift register circuit may be changed into a complementary metal oxide semiconductor (CMOS) circuit or other circuits, etc.

The present disclosure is not intended to limit the configuration or components of the shift register circuit. When all the transistors are P-type transistors, the first voltage signal VGH may be a high voltage level signal, and the second voltage signal VGL may be a low voltage level signal. When all the transistors are N-type transistors, the first voltage signal VGH may be a low voltage signal, and the second voltage signal VGL may be a high voltage signal.

By using seven transistors with only two clock signals, the disclosed shift register circuit may ensure active input at the first node and the second node of the shift register circuit, thereby reducing the impact of frequent transition of the second clock signal CK2 on the aforementioned nodes via the coupling effect of the parasitic capacitance. Accordingly, the output signal OUT may be outputted stably. Further, the disclosed shift register circuit may save cost, maintain the stability of the node voltage, and improve the stability of the output signal.

Further, embodiments of the present disclosure also provides a display device. The display device may include a gate electrode driving circuit formed by shift register circuits according to various embodiments of the present disclosure. Because the aforementioned shift register circuit may allow the output signal to be more stable, the output signal of the gate electrode driving circuit may be more stable. Accordingly, the disclosed display device may realize more stable output, thus improving the display quality.

Upon considering the specification and practicing the disclosed embodiments, those skilled in the art may easily conceive other implementation solutions of the present disclosure. The present disclosure is intended to cover any variation, uses, or adaptations of the present disclosure. Such variations, uses, or adaptations follow the general principles of the present disclosure and include common knowledge or customary technical means in the relevant technical field not disclosed by the present disclosure. The specification and the embodiments are deemed as exemplary only, and the true scope and spirit of the present disclosure are indicated by the appended claims.

What is claimed is:
1. A stage circuit, comprising:
cascaded shift register circuits, wherein each cascaded shift register circuit includes:
  a first control module, wherein the first control module receives an input signal and a charging signal, and generates a voltage signal at a second node in response to a first clock signal and a voltage signal at a first node;
  a second control module, where the second control module receives the input signal and a first voltage signal, and generates the voltage signal at the first node in response to the first clock signal, a second clock signal, and the voltage signal at the second node; and
  an output module, wherein the output module receives a first voltage signal and the second clock signal, and generates an output signal in response to the voltage signal at the second node and a voltage signal at a fourth node, wherein:
  a pulse width of the input signal is larger than a pulse width of the first clock signal, and within a second stage of driving the stage circuit, the input signal changes from a high voltage level to a low voltage level earlier than the first clock signal and changes from the low voltage level to the high voltage level later than the first clock signal;
  the first control module includes a first transistor and a third transistor, wherein the third transistor is configured to be turned on in response to the first clock signal to provide the charging signal to the second node, and the first transistor is configured to be turned on in response to the voltage signal at the first node to provide the input signal to the second node, and when the first transistor and the third transistor are turned on simultaneously, with an exception of a first stage cascaded shift register circuit, the charging signal of a current stage cascaded shift register circuit is transmitted through the third transistor and the first transistor to a signal output terminal of a previous stage cascaded shift register circuit, and
  the output module includes a sixth transistor, a seventh transistor and a first capacitor, wherein the sixth transistor is configured to be turned on in response to the voltage signal at the second node to provide the first voltage signal to the signal output terminal, the seventh transistor is configured to be turned on in response to a voltage signal at the fourth node to provide the second clock signal to the signal output terminal, wherein the voltage signal at the fourth node is positively correlated to the voltage signal at the first node, and a first end of the first capacitor is connected to a control end of the seventh transistor, and a second end of the first capacitor is connected to an output terminal of the current stage cascaded shift register circuit and a first transistor of one of remaining stage cascaded shift register circuits,
wherein:
with an exception of the first stage cascaded shift register circuit, a first transistor of the current stage cascaded shift register circuit has a first end connected to a signal output terminal of the previous stage cascaded shift register circuit, a second end connected to the second node, and a control end connected to the first node, and the second node is electrically insulated from the first clock signal.
2. The stage circuit of claim 1, wherein:
the second control module includes a second transistor, a fourth transistor, and a fifth transistor, the second transistor is configured to be turned on in response to the first clock signal to provide a voltage signal at a third node to the first node, the fourth transistor is configured to be turned on in response to the voltage signal at the second node, such that a first voltage signal is provided to a third node, a fifth transistor is configured to be turned on in response to the second clock signal, such that the voltage signal at the third node is provided to the first node, and a second capacitor electrically connected between the second node and the first voltage signal.

3. The stage circuit of claim 2, wherein:

the first transistor to the seventh transistor each has a first end, a second end, and a control end;

a control end of the second transistor receives the first clock signal, a first end of the second transistor receives the input signal, and a second end of the second transistor is electrically connected to the first node;

a control end of the third transistor receives the first clock signal, a first end of the third transistor receives the charging signal, and a second end of the third transistor is electrically connected to the second node;

a control end of the fourth transistor is electrically connected to the second node, and a first end of the fourth transistor receives the first voltage signal;

a control end of the fifth transistor receives the second clock signal, a first end of the fifth transistor is electrically connected to a second end of the fourth transistor, and a second end of the fifth transistor is electrically connected to the first node;

a control end of the six transistor is electrically connected to the second node, a first end of the sixth transistor receives the first voltage signal, and a second end of the sixth transistor is electrically connected to the signal output terminal; and a control end of the seventh transistor is electrically connected to the fourth node, a first end of the seventh transistor receives the second clock signal, and a second end of the seventh transistor is electrically connected to the signal output terminal.

4. The stage circuit of claim 2, wherein:

the first transistor to the seventh transistor each has a first end, a second end, and a control end;

a control end of the second transistor receives the first clock signal, a first end of the second transistor receives the input signal, and a second end of the second transistor is electrically connected to the first node;

a control end of the third transistor receives the first clock signal, a first end of the third transistor receives the charging signal, and a second end of the third transistor is electrically connected to the second node;

a control end of the fourth transistor is electrically connected to the second node, and a first end of the fourth transistor is electrically connected to the signal output terminal;

a control end of the fifth transistor receives the second clock signal, a first end of the fifth transistor is electrically connected to a second end of the fourth transistor, and a second end of the fifth transistor is electrically connected to the first node;

a control end of the six transistor is electrically connected to the second node, a first end of the sixth transistor receives the first voltage signal, and a second end of the sixth transistor is electrically connected to the signal output terminal; and a control end of the seventh transistor is electrically connected to the first node, a first end of the seventh transistor receives the second clock signal, and a second end of the seventh transistor is electrically connected to the signal output terminal.

5. The stage circuit of claim 2, wherein:

the first node and the fourth node are a same node.

6. The stage circuit of claim 2, each of the cascaded shift register circuit further comprising:

an eighth transistor, configured to be turned on in response to the second voltage signal, wherein the eighth transistor is electrically connected between the first node and the fourth node.

7. The stage circuit of claim 2, wherein:

the charging signal is the second voltage signal.

8. The stage circuit of claim 1, wherein:

the charging signal is the first clock signal.

9. The stage circuit of claim 1, wherein:

all the transistors are P-type transistors.

10. The stage circuit of claim 1, wherein:

all the transistors are N-type transistors.

11. The stage circuit of claim 2, wherein:

the first voltage signal is a high voltage level signal, and the second voltage signal is a low voltage level signal; or the first voltage signal is a low voltage level signal, and the second voltage signal is a high voltage level signal.

12. The stage circuit of claim 2, wherein:

low voltage duty cycles of the first clock signal and the second clock signal are both lower than ½, and the first clock signal and the second clock signal are differed by ½ signal cycle; or high voltage duty cycles of the first clock signal and the second clock signal are both lower than ½, and the first clock signal and the second clock signal are differed by ½ signal cycle.

13. A driving method of the stage circuit of claim 1, comprising:

in the first stage, controlling, by the first clock signal, the input signal and the first voltage signal, the second transistor, the third transistor, and the seventh transistor to be turned off, controlling, by the second clock signal, the fifth transistor to be turned on, and transmitting, by the sixth transistor, the first voltage signal to the signal output terminal;

in the second stage, controlling, by the first clock signal and the input signal, the first transistor, the second transistor, the third transistor, the fourth transistor, the sixth transistor, and the seventh transistor to be turned on, controlling, by the second clock signal, the fifth transistor to be turned off, and transmitting, by the sixth transistor, the first voltage signal to the signal output terminal;

in a third stage, controlling, by the first clock signal and the input signal, the second transistor, the third transistor, the fourth transistor, and the sixth transistor to be turned off, controlling, by the second clock signal, the fifth transistor to be turned on, and transmitting, by the seventh transistor, the second voltage signal to the signal output terminal;

in a fourth stage, controlling, by the first clock signal, the second transistor and the third transistor to be turned on, controlling, by the input signal and the second clock signal, the first transistor, the seventh transistor and the fifth transistor to be turned off, and transmitting, by the sixth transistor, the first voltage signal to the signal output terminal; and in a fifth stage, controlling, by the first clock signal and the input signal control, the second transistor, the third transistor, the first transistor, and the seventh transistor to be turned off, controlling, by the second clock signal, the fifth transistor to be turned on, and transmitting, by the sixth transistor, the first voltage signal to the signal output terminal, wherein the input signal is kept at a high voltage level in the fourth stage and the fifth stage, such that the voltage signal at the second node is stable.

14. The stage circuit of claim 13, wherein:
in the second stage, the first transistor and the third transistor are configured to be turned on by the first clock signal and the input signal, and
the charging signal is transmitted through the third transistor and the first transistor to the signal output terminal of the previous stage cascaded shift register circuit.

15. A display panel including a stage circuit, wherein the stage circuit includes cascaded shift register circuits, wherein each cascaded shift register circuit includes:
a first control module, wherein the first control module receives an input signal and a charging signal, and generates a voltage signal at a second node in response to a first clock signal and a voltage signal at a first node;
a second control module, where the second control module receives the input signal and a first voltage signal, and generates the voltage signal at the first node in response to the first clock signal, a second clock signal, and the voltage signal at the second node; and
an output module, wherein the output module receives a first voltage signal and the second clock signal, and generates an output signal in response to the voltage signal at the second node and a voltage signal at a fourth node, wherein:
a pulse width of the input signal is larger than a pulse width of the first clock signal, and within a second stage of driving the stage circuit, the input signal changes from a high voltage level to a low voltage level earlier than the first clock signal and changes from the low voltage level to the high voltage level later than the first clock signal;
the first control module includes a first transistor and a third transistor, wherein the third transistor is configured to be turned on in response to the first clock signal to provide the charging signal to the second node, and the first transistor is configured to be turned on in response to the voltage signal at the first node to provide the input signal to the second node, and when the first transistor and the third transistor are turned on simultaneously, with an exception of a first stage cascaded shift register circuit, the charging signal of a current stage cascaded shift register circuit is transmitted through the third transistor and the first transistor to a signal output terminal of a previous stage cascaded shift register circuit, and
the output module includes a sixth transistor, a seventh transistor and a first capacitor, wherein the sixth transistor is configured to be turned on in response to the voltage signal at the second node to provide the first voltage signal to the signal output terminal, the seventh transistor is configured to be turned on in response to a voltage signal at the fourth node to provide the second clock signal to the signal output terminal, wherein the voltage signal at the fourth node is positively correlated to the voltage signal at the first node, and a first end of the first capacitor is connected to a control end of the seventh transistor, and a second end of the first capacitor is connected to an output terminal of the current stage cascaded shift register circuit and a first transistor of one of remaining stage cascaded shift register circuits,
wherein:
with an exception of the first stage cascaded shift register circuit, a first transistor of the current stage cascaded shift register circuit has a first end connected to a signal output terminal of the previous stage cascaded shift register circuit, a second end connected to the second node, and a control end connected to the first node, and the second node is electrically insulated from the first clock signal.

16. The display panel of claim 15, wherein:
the second control module includes a second transistor, a fourth transistor, and a fifth transistor,
the second transistor is configured to be turned on in response to the first clock signal to provide a voltage signal at a third node to the first node,
the fourth transistor is configured to be turned on in response to the voltage signal at the second node, such that a first voltage signal is provided to a third node,
a fifth transistor is configured to be turned on in response to the second clock signal, such that the voltage signal at the third node is provided to the first node, and
a second capacitor electrically connected between the second node and the first voltage signal.

* * * * *